US009724869B2

(12) United States Patent
Niskala et al.

(10) Patent No.: US 9,724,869 B2
(45) Date of Patent: Aug. 8, 2017

(54) MULTILAYER STRUCTURE FOR ACCOMMODATING ELECTRONICS AND RELATED METHOD OF MANUFACTURE

(71) Applicant: TactoTek Oy, Oulunsalo (FI)

(72) Inventors: Paavo Niskala, Oulu (FI); Jarmo Saaski, Kempele (FI); Pasi Raappana, Kempele (FI); Mikko Heikkinen, Oulu (FI); Mikko Sippari, Oulunsalo (FI); Jarkko Torvinen, Kempele (FI); Antti Keranen, Oulu (FI)

(73) Assignee: TACTO TEK OY, Oulunsalo (FI)

( * ) Notice: Subject to any disclaimer, the term of this patent is extended or adjusted under 35 U.S.C. 154(b) by 225 days.

(21) Appl. No.: 14/583,940

(22) Filed: Dec. 29, 2014

(65) Prior Publication Data
US 2016/0192474 A1    Jun. 30, 2016

(51) Int. Cl.
| H05K 1/00 | (2006.01) |
| B29C 51/14 | (2006.01) |
| H05K 1/18 | (2006.01) |
| G06F 1/16 | (2006.01) |
| H05K 3/00 | (2006.01) |

(Continued)

(52) U.S. Cl.
CPC .............. *B29C 51/14* (2013.01); *G06F 1/163* (2013.01); *G06F 1/1652* (2013.01); *G06F 1/1658* (2013.01); *H05K 1/185* (2013.01); *H05K 1/189* (2013.01); *H05K 3/0014* (2013.01); *B29C 51/16* (2013.01); *B29L 2031/3406* (2013.01); *B29L 2031/3425* (2013.01); *B29L 2031/3431* (2013.01); *B29L 2031/3481* (2013.01); *H05K 2201/0108* (2013.01); *H05K 2201/0133* (2013.01); *H05K 2201/0145* (2013.01);
(Continued)

(58) Field of Classification Search
USPC ........................... 361/749, 679.55, 748, 750
See application file for complete search history.

(56) References Cited

U.S. PATENT DOCUMENTS

| 6,027,958 A | 2/2000 | Vu et al. |
| 2011/0102569 A1* | 5/2011 | Erhart ................ G06K 9/00053 348/77 |

(Continued)

OTHER PUBLICATIONS

International Search Report issued in Application No. PCT/FI2015/050949 dated May 9, 2016.

(Continued)

*Primary Examiner* — Andargie M Aychillhum
(74) *Attorney, Agent, or Firm* — Robert P. Michal, Esq.; Carter, DeLuca, Farrell & Schmidt, LLP

(57) ABSTRACT

Multilayer structure (200) for electronic devices, including a flexible substrate film (102) for accommodating electronics, a number of electrical elements (204, 206) provided to the flexible substrate film, preferably by element of printed electronics and/or surface mounting, a protective layer (104) laminated onto at least first surface of the substrate film, the protective layer being configured to mask perceivable physical deviation of the substrate, such as uneven surface profile or coloring, substantially at the location of the number of elements, from outside perception, optionally visual perception and/or tactile inspection taking place via the protective layer, and plastic layer (106) molded over at least second surface of the substrate film opposite to the first surface. A corresponding method of manufacture is presented.

21 Claims, 3 Drawing Sheets

(51) Int. Cl.
  *B29L 31/34*  (2006.01)
  *B29C 51/16*  (2006.01)
(52) U.S. Cl.
  CPC .............. *H05K 2201/0154* (2013.01); *H05K 2201/09118* (2013.01); *H05K 2201/10545* (2013.01)

(56) References Cited

U.S. PATENT DOCUMENTS

2011/0175102 A1* 7/2011 Hatano ............... H01L 51/5243
  257/72
2013/0299789 A1   11/2013 Yamazaki et al.

OTHER PUBLICATIONS

Written Opinion issued in Application No. PCT/FI2015/050949 dated May 9, 2016.

* cited by examiner

MULTILAYER STRUCTURE FOR ACCOMMODATING ELECTRONICS AND RELATED METHOD OF MANUFACTURE

FIELD OF THE INVENTION

Generally the present invention relates to electronics. In particular, however not exclusively, the invention pertains to manufacturing a multilayer structure comprising electronics on a flexible substrate.

BACKGROUND

Generally there exists a variety of different multilayer structures in the context of electronics and electronic products. Multilayered solutions may be manufactured using thermoforming, molding, adhesives, heat and/or pressure based lamination, etc. In-mold decoration (IMD)/in-mold labeling (IML) may be harnessed to incorporate desired coloring and e.g. graphical patterns within the structure.

The motivation or need striving for multilayer structures may be as diverse as the related use contexts. Relatively often size savings, weight savings, cost savings, or just efficient integration of components is sought for when the determined solution ultimately exhibits a multilayer nature. In turn, the associated use scenario may relate to product packages or food casings, visual design of device housings, displays, detectors or sensors, vehicle interiors, antennae, labels, etc.

Electronics such as electronic components, ICs (integrated circuit), and conductors, may be generally provided into or onto a multilayer structure by a plurality of different techniques. Naturally ready-made electronics such as available surface mount devices (SMD) may be mounted on a substrate that ultimately forms an inner or outer layer of a multilayer structure. Additionally, technologies falling under the term "printed electronics" may be applied to actually produce electronics directly to the associated substrate. The term "printed" refers in this case to various printing techniques capable of producing electronics/electrical elements, including but not limited to screen printing, flexography, and inkjet printing.

When the electronics is included in a multi-layer structure such that it is embedded between a number of surrounding material layers, the interface between the layers and the electronics, e.g. between the substrate of the electronics and the actual mounted or printed electronics, is affected, which causes deforming and staining of the materials. These phenomena are often noticeable from outside the structure by the user thereof. For instance, the resulting aesthetic and tactile discontinuities, or 'errors', such as perceivable, abrupt color changes within the multilayer structure and unintended roughness or unevenness of the surface of the multilayer structure arising from the internal deformation, respectively, may confuse the user in a number of ways and reduce the usability, durability and quality impression (if not actually quality, which is possible as well depending on the technical attributes used for assessing it) of the overall product including the multilayer structure.

SUMMARY

The objective of the present invention is to at least alleviate the above defects associated with multilayer structures comprising embedded electronics.

The objective is achieved with embodiments of a multilayer structure and related method of manufacture in accordance with the present invention.

According to one aspect of the present invention, a multilayer structure for electronic devices comprises
a flexible substrate film for accommodating electronics,
a number of electrical elements provided to said flexible substrate film, preferably by means of printed electronics and/or surface mounting,
a protective layer on at least first surface of said substrate film, said protective layer being configured to mask perceivable physical deviation of the substrate, such as uneven surface profile or coloring, substantially at the location of said number of elements, from outside perception, optionally visual perception and/or tactile inspection, taking place via the protective layer, and
plastic layer molded over at least second surface of said substrate film opposite to said first surface.

According to one other aspect, a method for manufacturing a multilayer structure for electronic devices, comprises
obtaining a flexible substrate film for accommodating electronics, provided with a protective layer on at least first surface of the substrate film, said protective layer being configured to mask perceivable physical deviation of the substrate, such as uneven surface profile or coloring, substantially at the location of a number of electrical elements further provided to the film, from outside perception, preferably visual perception and/or tactile inspection taking place via the protective layer, and
molding plastic layer onto at least second surface of said substrate film opposite to said first surface.

In one preferred embodiment, the substrate may be first provided with at least some electronics followed by the provision of protective layer thereon by lamination, which may refer to attaching a ready-made layer to the substrate or manufacturing of the layer directly thereon by a suitable coating technology, for instance.

Depending on the embodiment, e.g. the execution order of laminating and molding steps may be reversed. The molding phase may generally comprise injection molding wherein the substrate and optionally protective layer may act as insert. Yet, in some embodiments at least part of the electronics containing the electrical elements could be provided subsequent to the lamination, i.e. after forming of substrate-protective layer laminate.

In some embodiments, there may be a plurality of substrate films, protective layers and/or plastic layers in the obtained multilayer construction, whereupon the associated manufacturing method may incorporate multiple electronics provision, lamination and/or molding steps as well. Multi-shot molding technology is applicable too.

The utility of the present invention arises from a plurality of issues depending on each particular embodiment thereof. Flexible, thin, light and tactilely and optically desired (e.g. opaque, translucent, transparent, colored, patterned, etc.) multilayer structure comprising predetermined functionalities as provided by the embedded electronics may be obtained using a process that is relatively efficient, rapid, reliable (good yield), and flexible in terms of the applied method steps, used materials, dimensions and shapes, and scalability. The multilayer structure may be provided with additional features such as optionally embedded visual decorations or indicative graphics that are obtainable through various printing methods, for example. Yet, the substrate comprising electronics may be subjected to thermoforming already prior to molding so that the target 3d shape is cleverly obtained for the structure.

In particular, the present invention may facilitate blotting or evening out visual discontinuities at the interface of embedded electronics and neighbouring layers such as the one or more substrates of the electronics. The effect of undesired and unintended discolorations, color changes, and shadings may be reduced or eliminated. Further, the unevenness of the multilayer surface due to internal deformation resulting from the molding procedure and the embedded electronics may be alleviated or at least masked from the standpoint of tactile and/or visual inspection. The protective layer may itself incorporate, besides optimized coloring, uneven surface profile. Such profile may well mask other unevenness. Yet, the protective layer may comprise resilient (flexible) material and effectively conform to the projective features of electrical elements and potential other elements on the underlying substrate. Whether these different advantageous features do get realized simultaneously, depends on the embodiment in question and used materials, their properties, dimensions, the nature, location and number of embedded components, etc.

The expression "a number of" may herein refer to any positive integer starting from one (1).

The expression "a plurality of" may refer to any positive integer starting from two (2), respectively.

The expression "electrical element" may herein generally refer to a conductor, contact area, connector, electronic or electrical component, circuit, integrated circuit (IC), sub-assembly, sub-system, etc. providable to the multilayer structure of the present invention by mounting or printing, or through other applicable installation or production method.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
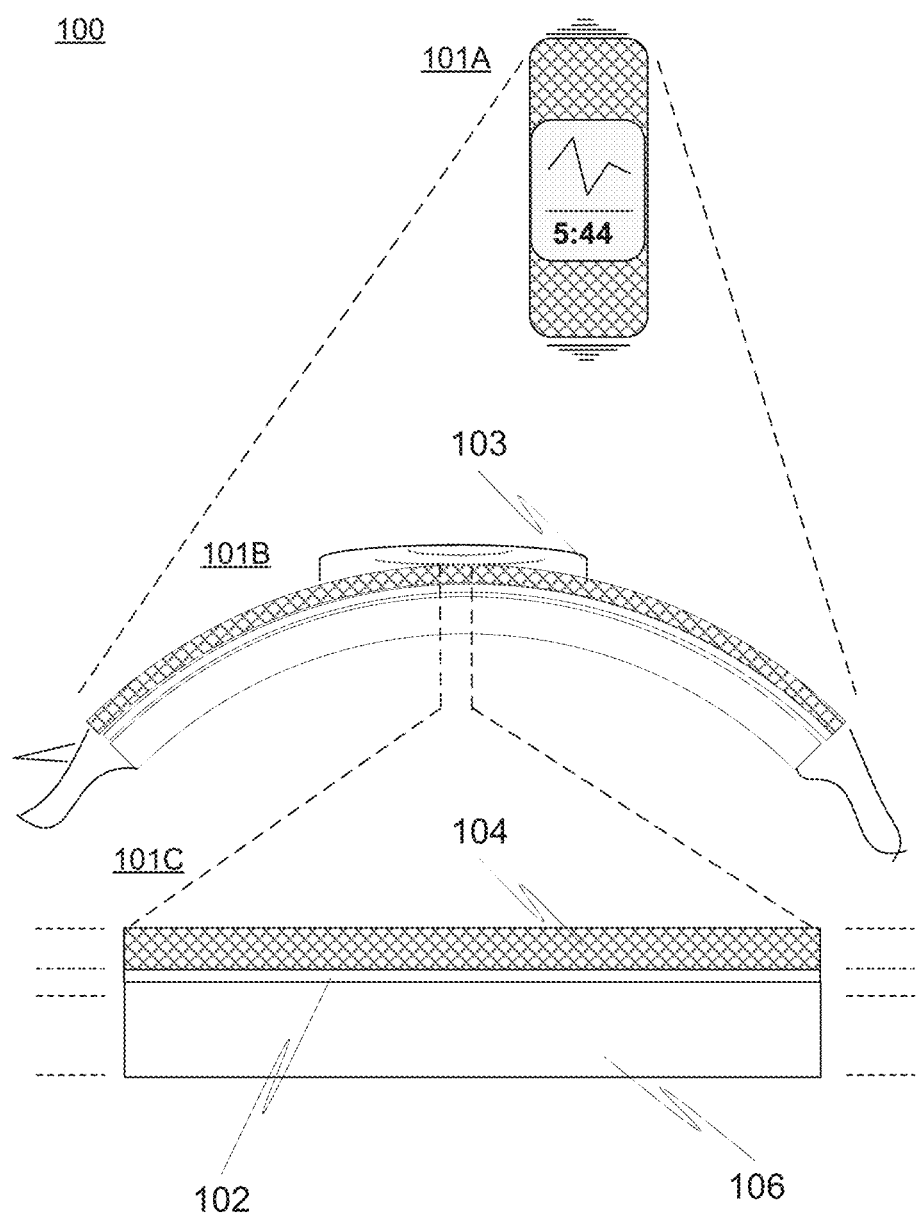
FIG. 1 illustrates one use scenario and embodiment of the present invention wherein a curved/flexible multilayer structure is obtained for use with an electronic product such as armband or wristband computer.

FIG. 1 illustrates, at 100, one, merely exemplary, use scenario and embodiment of the present invention wherein a curved/flexible multilayer structure has been obtained for use with an electronic product, such as armband or wristband computer, the front view of which is coarsely depicted at 101A. A person skilled in the art acknowledges the fact that the principles of the present invention may be well applied to non-curved/non-flexible substrates and constructions as well.

The target electronic product or device 101A incorporating the multilayer structure may include e.g. a consumer electronics device, industrial electronics, automation equipment, machinery, automotive product, safety or protection device, computer, tablet, phablet, mobile terminal such as cell phone, alarming device, wearable electronics/product (garment, headwear, footwear, etc.), sensor device, measurement device, display device, game controller or console, lighting device, multimedia or audio player, AV device, sports gear, communication device, transport or carrying equipment, battery, optical device, solar panel or solar energy device, transmitter, receiver, wirelessly controlled device, or controller device.

At 101B, a side view of the curved and/or flexible device 101A is shown, wherein the structure further hosts a display element 103. Alternatively, the display 103 could have been partially or fully embedded within the structure so that the viewing portion thereof defines a part of the (potentially substantially continuous and/or flat) exterior surface of the product or is at least covered by substantially optically transparent material to enable inspecting the screen activity. The display 103 may be touch-sensitive thus implementing touchscreen functionality. The structure may have been supplemented with a number of switches, buttons, knobs, etc. to provide dedicated control input means for the user. Again, a skilled person shall realize that all embodiments of the present invention do not have to include the display element 103, and a number of alternative or additional elements may be included, if any, having regard to the particular requirements of the related use context. The shown example has been selected mostly due to its compact nature and applicability in concretizing few core ideas of the suggested solution in a potential real-life use scenario.

At 101C, a closer look at a portion of the multilayer structure is provided. A flexible plastic film 102, optionally comprising or consisting of thermoplastic material, with first 102A and second 102B surfaces is adjacent to an attached protective layer 104 and a molded plastic layer 106. The shown dimensions are exemplary, but in many embodiments the film 102 may be substantially thinner than the molded layer 106 and also protective layer 104.

In various embodiments, the multilayer structure may actually comprise a plurality of flexible films, molded layers and/or protective layers, which may be mutually similar or different in terms of their configuration (e.g. dimensions, shape, orientation, materials, etc.), but for simplicity, the shown example exhibits only one layer of each above type. Also further layers, e.g. a decorative layer or indicative graphics-containing layer establishing e.g. symbols, pictures, or alphanumeric information may have been arranged to the structure. IMD or IML techniques are thus applicable.

Each provided layer may have been generally attached to the structure by lamination or directly produced thereto using e.g. suitable deposition/coating method or molding.

Figure 2:
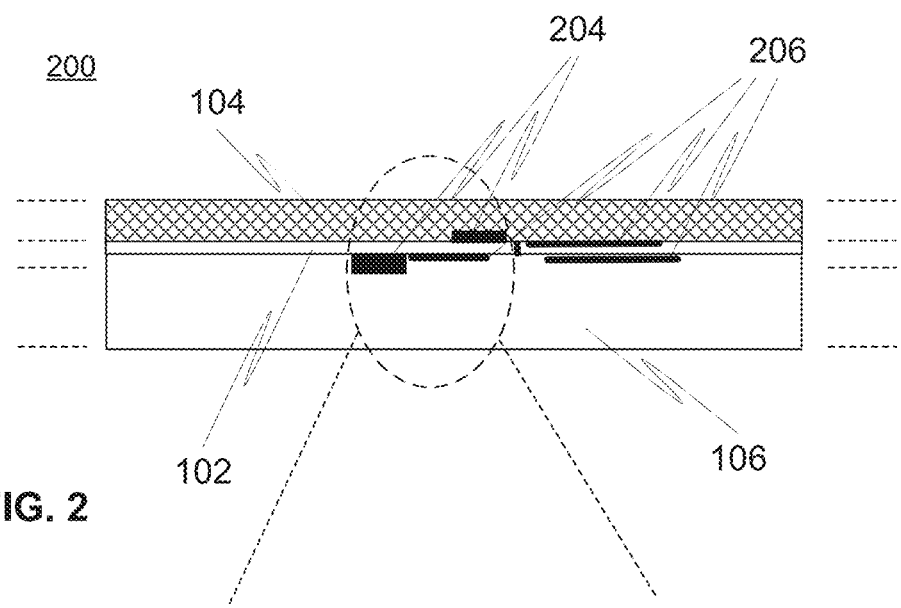
FIG. 2 illustrates the internals of a multilayer structure in accordance with an embodiment of the present invention.

FIG. 2 illustrates, at 200, the internals of e.g. the above multilayer structure with emphasis on the embedded electronics. Indeed, at least the flexible film 102 of potentially thermoplastic material has been provided with a number of electrical elements 204, 206 such as electronic components, conductors, or chips (ICs) by feasible manufacturing or mounting technology. Mounting techniques may include surface mounting and through-hole mounting, for instance. Manufacturing such as printing may refer to screen printing or inkjetting among various other options. Optionally, the layers of the obtained multilayer structure contain holes or other features for accommodating electronics. Generally the layers may bear flat shape but also more complex, essentially three-dimensional configurations are possible.

The obtained multilayer (stack) structure may optionally contain mutually different multilayer portions having regard to the number of overlapping layers. At some location, there may be a greater number of stacked layers (i.e. additional layer(s)) than in other location. Generally the layers may be superposed but different in terms of unity (some layer(s)

may be built up from e.g. a plurality of distributed elements substantially on the same lateral plane), width, and/or height. All the layers do not have to reside mutually superposed but may be located differently along the height of the multilayer stack. Naturally the successive layers have to contact each other at least in places. The layers may contain through-holes or windows.

In the figure, numeral 204 refers to a component (e.g. active, passive, or electromechanical) or circuit, whereas numeral 206 refers to conductors or other conductive areas, which may generally be, but do not have to be, flatter than the components/circuits 204. The numeral 204 may further refer to electronics sub-assembly or sub-system. The sub-assembly/system may incorporate a flexible or rigid substrate of its own, e.g. polyimide-based FPC (flexible printed circuit), or a rigid PCB (printed circuit board, e.g. FR4). Electronics such as a number or desired components may have been provided to such substrate by soldering to obtain a generally higher component density than with e.g. printed electronics, provided that the used materials indeed tolerate soldering without being damaged.

Yet, the neighbouring protective 104 and molded 106 layers may have been provided with electronics of their own. In addition to electronics, the layers of the multilayer structure may incorporate other elements or features such as decorative features as alluded hereinbefore. For instance, chemically active layers or features may have been included.

Figure 3:
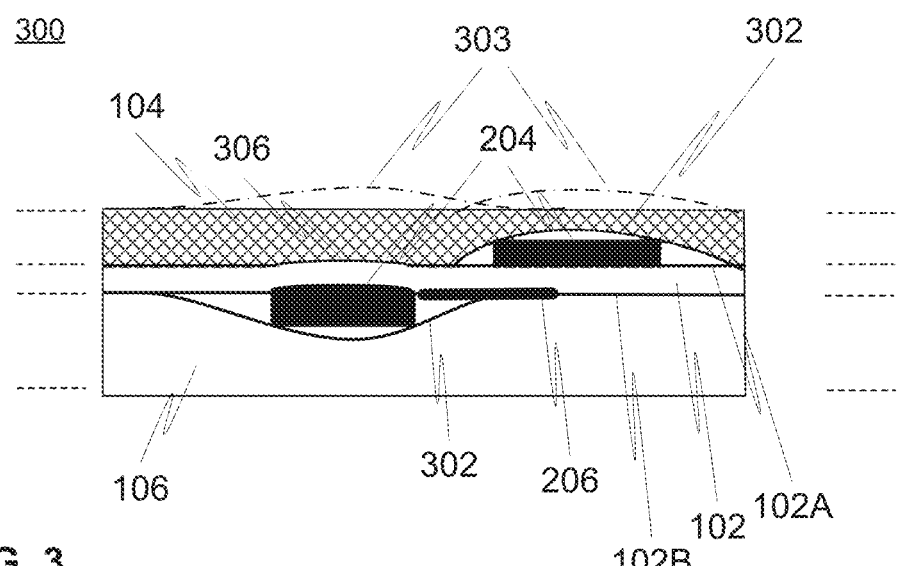
FIG. 3 illustrates a magnified portion of a multilayer structure of FIG. 2.

FIG. 3 depicts, at 300, a magnification of a portion of the multilayer structure of FIG. 2 surrounded by a dotted ellipse. The figure illustrates how the suggested solution may be utilized to fight against visually or tactilely annoying artifacts arising from the molding of layer 106 on the substrate film 102 accommodating the electronics 204, 206. As the film 102 comprises electronics having some finite thickness, length, shape, etc., the interface to neighbouring layers 104, 106 will be inevitably affected by additional stress or pressure when the molded layer 106 and potentially protective layer 104 are introduced thereon. This may induce color deviation, perceivable shadows within the structure, as well as structure deformation. The embedded electronics and other elements may cause the whole multilayer structure to deform such that e.g. bumps may show up on the surface at the locations substantially corresponding to the underlying elements. Also the mounting or manufacturing of the electronics may itself cause undesired effects at the interface and e.g. the substrate thereat. Unintentional coloring, staining or absorption/diffusion of e.g. conductive inks, pastes, or adhesives to the near-by substrate(s) or other layers may take place.

In FIG. 3, the dotted lines 303 indicate potential outcome (excluding color defects) in scenarios wherein the principles of the present invention are not followed to the necessary extent. The electronics 204 on substrate 102 are pushed towards the top surface of the multilayer structure by the molded plastics 106 so that the top layer (or layers, if multiple are present) 104 bends significantly upwards. Obviously the intermediate layers and interfaces may bend or deform as well with reference to the bend of substrate 102 and protective layer 104 at location 306 above lower element 204. However, in various embodiments of the present invention such protrusions do not appear or at least their size is reduced. Additionally or alternatively, the aesthetic or tactile effect of surface protrusions and also of defects at the internal interfaces of the structure (color discontinuities, staining, diffusion, etc.) may be minimized The protective layer 104 may be configured to protect the substrate film against physical impacts, radiation, light, heat, cold, moisture, and/or dirt, for instance. The protective properties can be attained by appropriately selecting the thickness and material of the layer as well as attaching technique for fixing the layer in the multilayer structure.

In particular, the protective layer 104 is advantageously configured to mask perceivable and undesired physical deviation of the substrate, such as uneven, bent surface profile, shadowing or coloring (due to staining, deformation, diffusion, etc.) at the location of the elements 204, 206, from outside perception, by which it is mainly referred to visual perception and/or tactile inspection.

In one embodiment, the protective layer 104 comprises elastic, or 'resilient', material to conform, at the interface between the protective layer and the substrate film, to the surface profile of the substrate film provided with said number of elements. Thus, the protrusions on the external surface of the multilayer structure are at least reduced if not essentially avoided.

Additionally or alternatively, at least one protective layer may be colored so as to mask the deviation.

The coloring of the protective layer 104 may be configured to blot out the deviations, optionally via a graphical and/or color pattern. Different forms, symbols, pictures, numbers, characters, words, etc. may be produced thereto (or they may be naturally or inherently present) so as to provide the desired masking effect.

The coloring of the protective layer 104 may substantially follow the coloring of the film so that artifacts introduced thereto by the electronics or molding procedure, are masked from external (visual) investigation.

The protective layer 104 may be at least partially translucent or opaque to blot out the deviations, optionally further comprising optically substantially transparent windows or regions having regard to predefined wavelengths.

Yet, the protective layer 104 may comprise uneven (top/external) surface profile, optionally with protrusions, ridges, grooves, recesses, dimples, scale pattern, and/or notches. The surface profile of the layer 104 may be inherently as such, and/or such profile may be technically produced by carving, milling, engraving, stamping or embossing, for example. The uneven surface profile and texture of the layer 104 may visually and/or tactilely mask the undesired visual and topographical deviation (e.g. random-like unevenness), respectively, otherwise caused by the underlying layers 102, 106 and elements 204, 206.

The protective layer 104 may comprise material such as plastics (e.g. TPU (thermoplastic polyurethane) or other thermoplastic elastomer (TPE)), metal, leather, other biological, organic and/or textile material.

Besides having the protective and masking function, the protective layer 104 may provide the desired appearance and feel or texture to the multilayer structure by the used colors, graphical patterns, texture, etc. In the case of biological material, the layer 104 may include or imitate e.g. leather, scaly cover or lizard/snakeskin or other similar material providing strong visual appearance, efficient masking effect and characteristic tactile feel.

Yet, indicative and/or instructive function may be accomplished by providing the protective layer 104 or underlying layers with indicative graphics (symbols, text, etc.).

In addition to substrate 102, the protective layer(s) 104 may comprise electrical elements, optionally conductors, preferably printed thereon (on the inner surface, for instance, facing the other embedded electronics, and/or on the outer surface with optional through-connections leading to the structure internals).

Reverting again to the scenario explicitly presented in FIG. 3, the dome shapes 302 (recess in layer 106 and projection in layer 104) represent the arisen anomalies of carrier (substrate) and neighbouring layers 104, 106 inside the multilayer structure due to the embedded electronics that the layers 104, 106 directly or indirectly physically contact and are faced with. The molded layer 106 has been preferably provided in a melted state so that it has bypassed and surrounded the elements 204, 206, however causing pressure/force and related stress to the existing layers 102, 104 that are basically being pushed away from their original, natural position. As the materials of layer 104 have been selected properly with sufficient resiliency and/or other kind of adaptivity having regard to external obstacles, the surface protrusions 303 are preferably avoided or at least reduced in size.

In the shown case all the layers 102, 104, 106 accommodate at least portion of some electronic element 204, 206. Even though the substrate layer 102 is bent to curve upwards causing the protective layer 104 to withdraw at 306, the layer 104 has been configured in terms of e.g. material resiliency so that the bump 303 above is preferably substantially omitted or at least considerably reduced.

Alternatively or additionally, the surface structure (profile) or colors, graphics, patterns, etc. of the layer 104 may have been selected so as to tactilely and/or visually mask the effect of bump 303 even if basically present thereat. As mentioned hereinbefore, the outer surface of the layer 104 facing the external environment may have been provided with uneven surface profile for the purpose. Such surface profile may be tactilely pleasant and follow e.g. some regular or pseudo-regular pattern. Still, the inner surface of the layer 104 facing the electronics 204, 206 could have been additionally, or in some scenarios potentially alternatively, provided e.g. with recess(es) for accommodating protruding parts of the electronics 204, 206 pushed towards it by the molded plastics layer 106, therefore reducing the size of the undesired bump 303 on the exterior surface of the layer 104.

Having regard to potential properties of the substrate film 102, it may be less than about 300 microns thick, preferably less than about 200 microns thick, and most preferably less than about 150 microns thick, for example.

The substrate film 102 may comprise e.g. plastics/polymer, such as Poly Carbonate (PC), Poly Methyl Methacrylate (PMMA), polyimide, a copolymer of Methyl Methacrylate and Styrene (MS resin), Polyethylene Terephthalate (PET), or metal. These materials may also be utilized in the molded layer 106 and/or protective layer 104.

The film 102 may include relief forms or shapes such as protrusions, ridges, grooves, or recesses relative to the surface plane of the film, optionally through-holes. These features may be utilized to accommodate or at least partially embed elements such as conductors, components, etc. within the film 102. Similar features may be present in the protective layer 104.

Figure 4:
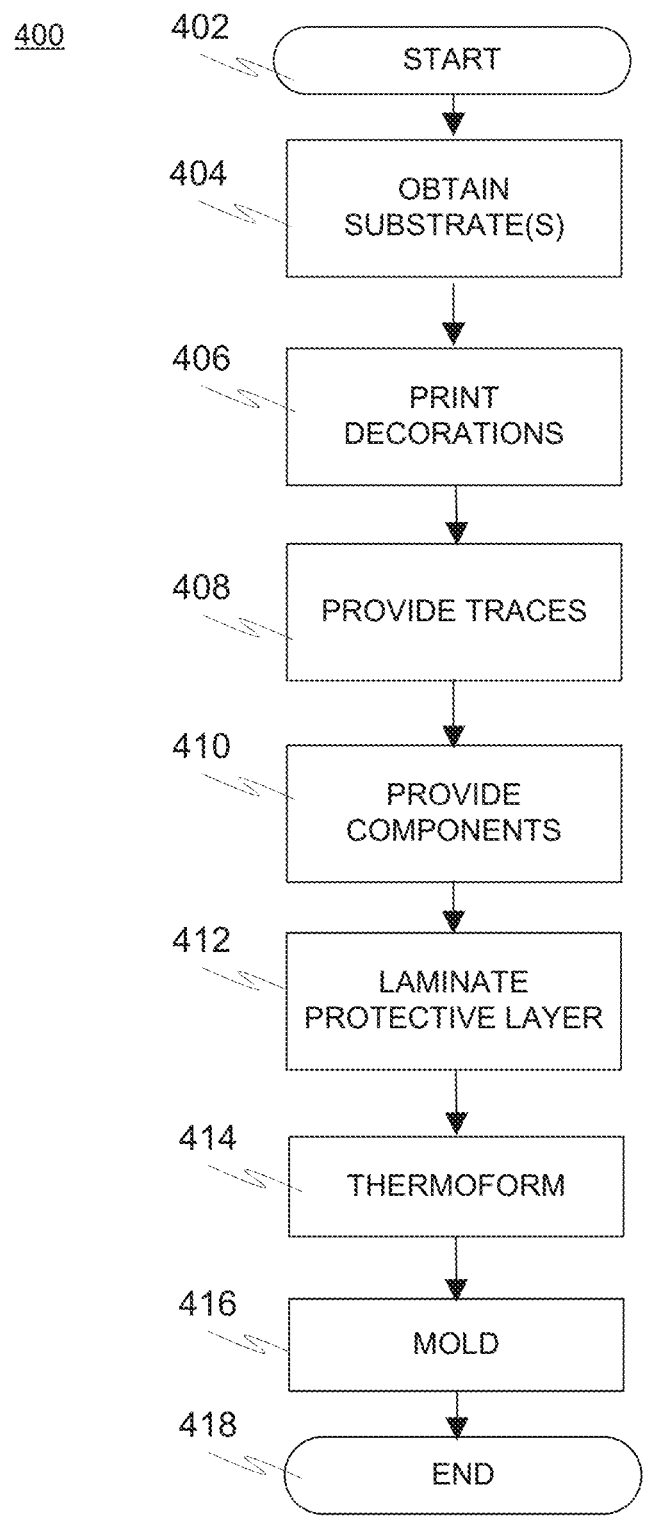
FIG. 4 is a flow diagram disclosing an embodiment of a method in accordance with the present invention.

FIG. 4 includes a flow diagram 400 disclosing an embodiment of a method in accordance with the present invention.

At 402, referring to a start-up phase, the necessary tasks such as material, component and tools selection, acquisition, calibration and other configuration may take place. Specific care must be taken that the individual elements and material selections work together and survive the selected manufacturing process of the multilayer structure and possible target product whereto the structure may be disposed, which is naturally preferably checked up-front on the basis of the manufacturing process specifications and component data sheets, or by investigating and testing the produced prototypes, for example. Molding/IMD, lamination, thermoforming, and/or printing equipment, among others, may be thus ramped up to operational status at this stage.

At 404, at least one, preferably flexible, substrate film for accommodating electronics is obtained. Ready-made substrate material, e.g. roll of plastic film, may be acquired and optionally processed such as coated, colored (if not initially of desired color or e.g. optimum degree of transparency or translucency), carved, embossed, shaped, etc., or the substrate itself may be in-house produced from scratch by molding or other methods from the desired starting material(s).

At 406, decorations, graphical indications, colors etc. may be produced onto the film by printing, for instance. This is optional item and may be omitted or position thereof altered in the method flow. Alternatively or additionally, other layers such as the protective layer could be provided with such features. For example, screen printing or inkjetting may be applied. Decorative or indicative (e.g. instructive) features may be generally provided using IMD/IML compatible methods.

At 408 and 410, electrical traces (conductors) may be provided to the desired locations of the substrate by printing, for example, and the components may be attached by appropriate mounting technique, respectively. FPC structure may be thus formed. Mounting may include using adhesive, paste and/or conductive ink for establishing and securing the desired mechanical and electrical connections, for instance. Items 408 and 410 may be executed repeatedly or alternately, depending on the embodiment, whereupon their separation into dedicated execution phases is not always necessary or even possible. Additionally or alternatively, in some embodiments, items 408 and/or 410 may be executed not until lamination 412 or thermoforming 414 described hereinafter has taken place.

At 412, at least one protective layer is laminated onto at least first surface (e.g. primary or predefined exterior surface of the structure, which may be the most visible layer to the user when the structure/host device is in use) of said substrate film so as to mask perceivable physical deviation of the substrate substantially at the location of said number of elements from outside perception. The perception (mostly visual and/or tactile, although the layer may have some characteristic odor, for example) may, depending on the embodiment and use case, take place via the protective layer, i.e. a user or other party perceives the multilayer structure via it. Additionally or alternatively, the perception may take place via the molded layer considering e.g. products wherein the multilayer structure remains exposed so that it may be inspected from various angles. Wristband or armband incorporating the structure may be one example of such products. However, even with these kinds of products, certain perception direction may be considered a primary one or the one of primary importance, such as the one of the protective layer.

Besides masking the deviation of the substrate, the protective layer may be configured so as to conform to the topography of the underlying layers as well as possible so that its own exterior surface shows minimum signs of deformation and/or actually deforms as little as possible. Optimum configuration may require finding suitable material thickness and resiliency in addition to possible further factors.

The protective layer may be established from the starting material during the lamination or ready-made layer of material may be fixed. Optional processing stages such as coating or cutting may apply.

Lamination may be executed, under the control of a skilled person and applicable equipment, using e.g. adhesive, pressure and/or heat. Care shall be taken that the material survives the procedure.

Instead of laminating a ready-made protective layer onto the substrate, basically any desired coating or other applicable technique suitable for the materials of the substrate and the protective layer itself may be utilized so as to establish the protective layer directly on the substrate from the associated material.

The protective layer may be provided with various features after lamination and/or prior to it, including e.g. electrical elements and/or through-holes. As mentioned above, in some embodiments the protective layer may be provided to the substrate prior to or in between the provision of the electrical elements such as traces and components.

At 414, forming such as thermoforming may optionally take place. During thermoforming, the substrate film, preferably already provided with electronics, may be shaped to a desired substantially three-dimensional shape. The electronics shall have been disposed preferably so as to avoid locations of greatest stress occurring during thermoforming, such as the locations of greatest pressure or curvature.

In some embodiments, the mutual execution order of items 412 and 414 may be reversed. Yet, item 412 and/or item 414 may be executed after molding 416.

Generally, instead of mounting or producing electrical elements to the surface(s) of the layer(s) of the multilayer structure, they may be embedded therein, e.g. in different recesses thereof.

At 416, a preferably plastic layer, e.g. of thermoplastic, thermosetting, or elastomeric material, is molded over at least the second surface of said substrate film opposite to said first surface. Injection molding may be applied. The substrate and optionally the protective layer(s) (if already present) may be used as an insert in the mold. Optionally multi-shot or multi-component molding is applied to provide e.g. multiple materials to the structure. Plastic layer may be at least partially optically transparent and/or comprise recesses or through-holes to provide visual path to the underlying electronics that may include optoelectronic components (LEDs, photosensitive detectors) or e.g. a display such as OLED (organic LED, Light Emitting Diode) display. The plastic layer may additionally or alternatively contain opaque, e.g. colored or graphics-containing, or translucent portions. It may be further provided with surface relief forms or other features for various purposes, such as for optical use (e.g. light incoupling, outcoupling, scattering, or reflection).

A person skilled in the art shall know beforehand or determine by field testing the optimum process parameters in the light of used materials, dimensions and components. Few merely exemplary guidelines can be given for general guidance. When the substrate film is PET and the plastics to be overmolded thereon is PC, the temperature of the melted PC may be between 280 and 320 deg.C and applicable mold temperature may range from about 20 to 95 deg.C, i.e. it may be about 80 deg.C, for example. The used substrate film and the process parameters shall be selected such that the substrate remains substantially solid during the process. Potentially preinstalled electronics have been preferably attached to the substrate such that they remain static during the molding.

Optionally, roll-to-roll technique may be utilized during the execution of the manufacturing method at least for selected phases, such as the provision of the substrate with traces/components or the integration of layers together. Application of roll to roll requires some flexibility from the used material layers. Accordingly, the end product (the obtained multilayer structure or even a device ultimately hosting it) may be flexible. However, the present invention is in practice applicable also to scenarios with more rigid material sheets or generally, pieces of desired material.

At 418, the method execution is ended.

The scope of the present invention is determined by the attached claims together with the equivalents thereof. A person skilled in the art will appreciate the fact that the disclosed embodiments were constructed for illustrative purposes only, and the innovative core of the suggested solution reviewed hereinbefore will cover further embodiments, embodiment combinations, variations and equivalents that better suit each real-life use case. Regarding the provided multilayer structure, in some embodiments the construction may, for instance, include a plurality of substrates, protective layers and/or molded layers instead of merely one instance per layer type. Similar layers may be adjacent to each other, have different layer(s) in between, or establish some other configuration in the multilayer structure. A number of further layers not explicitly reviewed hereinbefore may be included in the structure as well, e.g. a thermally, electrically, chemically, or otherwise insulating/blocking, conductive or active layer.

The invention claimed is:

1. A multilayer structure for electronic devices, the multilayer structure comprising:
   a flexible plastic substrate film for accommodating electronics;
   a number of electrical elements provided to the flexible plastic substrate film by printed electronics and/or surface mounting;
   a protective layer on at least a first surface of the flexible plastic substrate film, the protective layer being configured to mask perceivable physical deviation of the flexible plastic substrate film, such as uneven surface profile or coloring, substantially at the location of the number of electrical elements, from outside perception and/or tactile inspection taking place via the protective layer; and
   a plastic layer molded onto at least a second surface of the flexible plastic substrate film opposite to the first surface,
   wherein the protective layer includes conductors printed thereon.

2. The structure of claim 1, wherein the first surface of the flexible plastic substrate film comprises at least part of the number of electrical elements.

3. The structure of claim 1, wherein the second surface of the flexible plastic substrate film comprises at least part of the number of electrical elements.

4. The structure of claim 1, wherein the protective layer comprises elastic material to conform, at the interface between the protective layer and the flexible plastic substrate film, to the surface profile of the flexible plastic substrate film provided with the number of electrical elements and having the plastic layer molded on the second surface thereof.

5. The structure of claim 1, wherein the protective layer is colored to mask the deviation.

6. The structure of claim 5, wherein the coloring of the protective layer is configured to blot out the deviations, optionally via color pattern.

7. The structure of claim 5, wherein the coloring of the protective layer substantially follows the coloring of the flexible plastic substrate film.

8. The structure of claim 1, wherein the protective layer comprises uneven surface profile, optionally with a number of protrusions, ridges, grooves, dimples, surface reliefs, scale pattern, and/or notches.

9. The structure of claim 1, wherein the protective layer and/or molded layer is flexible, preferably the overall multilayer structure being also flexible.

10. The structure of claim 1, wherein the flexible plastic substrate film comprises at least one material selected from the group consisting of:
thermoplastic material, plastics, polymer, polycarbonate, polymethylmethacrylate, MS resin, PET, glass, polyimide, and metal.

11. The structure of claim 1, wherein the protective layer comprises at least one material selected from the group consisting of:
thermoplastic material, TPE (thermoplastics elastomer), plastics, metal, leather, biological material, and textile material.

12. The structure of claim 1, wherein the protective layer is configured to protect the flexible plastic substrate film against at least one element selected from the group consisting of:
impacts, radiation, light, heat, cold, moisture, and dirt.

13. The structure of claim 1, wherein the protective layer includes at least one indicative, instructive or decorative element selected from the group consisting of:
coloring, graphics, graphical pattern, light outcoupling or reflecting pattern such as a surface relief pattern, symbol, textual representation, and numerical representation.

14. The structure of claim 1, wherein the number of electrical elements include at least one element selected from the group consisting of:
a conductor, transistor, diode, resistor, capacitor, integrated circuit, light-emitting element, light detecting element, processing element, memory element, sensor, communications element, electronics sub-assembly, sub-system, and connector.

15. The structure of claim 1, wherein the flexible plastic substrate film is less than about 300 microns thick, preferably less than about 200 microns thick, and most preferably less than about 150 microns thick.

16. An electronic device, optionally a wristop device, armband device or other portable computer or a controller therefor, comprising the structure of claim 1.

17. The structure of claim 1, wherein the protective layer includes a textured surface profile.

18. A multilayer structure for electronic devices, the multilayer structure comprising:
a flexible substrate film for accommodating electronics;
a number of electrical elements provided to the flexible substrate film, by printed electronics and/or surface mounting;
a protective layer on at least a first surface of the flexible substrate film, the protective layer being configured to mask perceivable physical deviation of the flexible substrate film, such as uneven surface profile or coloring, substantially at the location of the number of electrical elements, from outside perception, and/or tactile inspection taking place via the protective layer; and
a plastic layer molded onto at least a second surface of the flexible substrate film opposite to the first surface,
wherein the protective layer is at least partially translucent or opaque to blot out the deviations, optionally further comprising optically substantially transparent windows or regions having regard to predefined wavelengths.

19. A method for manufacturing a multilayer structure for electronic devices, the method comprising:
obtaining a flexible substrate film for accommodating electronics, provided with a protective layer on at least a first surface of the flexible substrate film, the protective layer being configured to mask perceivable physical deviation of the flexible substrate film, such as uneven surface profile or coloring, substantially at the location of a number of electrical elements further provided to the flexible substrate film, from outside perception and/or tactile inspection taking place via the protective layer, and
molding a plastic layer over at least a second surface of the flexible substrate film opposite to the first surface.

20. The method of claim 19, further comprising thermoforming the electronics-provided substrate or substrate-protective layer laminate to a desired three-dimensional shape.

21. The method of claim 19, further comprising printing a number of decorative, indicative or instructive features on the flexible substrate film, optionally on the first and/or second surface thereof.

* * * * *